US010884049B2

(12) United States Patent
Montenegro et al.

(10) Patent No.: US 10,884,049 B2
(45) Date of Patent: Jan. 5, 2021

(54) DISTRIBUTION NETWORK COORDINATION IN THE PRESENCE OF INTERMITTENT FAULTS

(71) Applicant: S&C Electric Company, Chicago, IL (US)

(72) Inventors: Alejandro Montenegro, Chicago, IL (US); Yoav Sharon, Evanston, IL (US)

(73) Assignee: S&C Electric Company, Chicago, IL (US)

( * ) Notice: Subject to any disclaimer, the term of this patent is extended or adjusted under 35 U.S.C. 154(b) by 91 days.

(21) Appl. No.: 16/456,202

(22) Filed: Jun. 28, 2019

(65) Prior Publication Data

US 2020/0072894 A1    Mar. 5, 2020

Related U.S. Application Data

(60) Provisional application No. 62/725,323, filed on Aug. 31, 2018.

(51) Int. Cl.
*G01R 31/08*     (2020.01)
*H02H 1/00*      (2006.01)
*H02H 7/26*      (2006.01)

(52) U.S. Cl.
CPC ......... *G01R 31/086* (2013.01); *H02H 1/0007* (2013.01); *H02H 7/26* (2013.01)

(58) Field of Classification Search
CPC .. G01R 31/086; G01R 31/58; G01R 19/2513; H02H 1/0007; H02H 7/26; H02H 3/066; H02H 3/05; H02H 11/008
USPC .................................... 324/750.01, 537, 500
See application file for complete search history.

(56) References Cited

U.S. PATENT DOCUMENTS

2020/0076183 A1\* 3/2020 Montenegro ............ H02H 7/26
2020/0259320 A1\* 8/2020 Guo ........................ H02H 3/006
2020/0309841 A1\* 10/2020 Sharon ................ G01R 31/085

\* cited by examiner

*Primary Examiner* — Giovanni Astacio-Oquendo

(57) ABSTRACT

Detection of faults in an electrical power distribution network that includes measuring current flowing through a recloser in a feeder line, detecting a fault current indicating a fault is present in the feeder line, and opening a switch in the recloser in response to detecting the fault current. A first pulse having a first pulse duration time is generated, and the current flow in the recloser during the first pulse duration time is analyzed. A second pulse having a second duration time that is longer than the first pulse duration time is generated if it is determined that no fault current exists during the first pulse duration time, and the system voltages and the current flowing through the recloser after the second pulse duration time is analyzed for the presence of the fault.

19 Claims, 3 Drawing Sheets

DISTRIBUTION NETWORK COORDINATION IN THE PRESENCE OF INTERMITTENT FAULTS

CROSS-REFERENCE TO RELATED APPLICATION

This application claims the benefit of priority from the U.S. Provisional Application No. 62/725,323, filed on Aug. 31, 2018, the disclosure of which is hereby expressly incorporated herein by reference for all purposes.

BACKGROUND

Field

This disclosure relates generally to detecting intermittent faults in an electrical power distribution network and, more particularly, to a to detecting intermittent faults in an electrical power distribution network using a pulse testing.

Discussion of the Related Art

An electrical power distribution network, often referred to as an electrical grid, typically includes a number of power generation plants each having a number of power generators, such as gas turbine engines, nuclear reactors, coal-fired generators, hydro-electric dams, etc. The power plants provide a high voltage AC signal on high voltage transmission lines that deliver electrical power to a number of substations typically located within a community, where the voltage is stepped down to a medium voltage. The substations provide the medium voltage power to a number of feeder lines. The feeder lines are connected to a number of lateral lines that provide the medium voltage to various transformers, where the voltage is stepped down to a low voltage and is provided to a number of loads, such as homes, businesses, etc. Current propagating on the feeder and lateral lines will generate heat because of the resistivity of the line, which is dissipated to the environment.

Periodically, faults occur in the distribution network as a result of various things, such as animals touching the lines, lightning strikes, tree branches falling on the lines, vehicle collisions with utility poles, etc. Faults may create a short-circuit that significantly increases the load on the network, which may cause the current flow from the substation to significantly increase, such as anywhere between twice the normal load current up to 100 times the load current. This amount of current could cause damage to equipment ranging from the substation transformer to the electrical lines, where the lines may heat up and eventually melt. Many times the fault will be a temporary or intermittent fault as opposed to a permanent fault, where the event that caused the fault is cleared a short time after the fault occurs, for example, a lightning strike.

Generally, each lateral line is protected by a fuse that creates an open circuit when the temperature of the fuse goes above a certain melting point, which disconnects power from the loads being serviced by that lateral line. An operated fuse requires a worker from the service or utility company to identify which fuse has operated, and replace it after the fault has been removed or cleared. However, fuses are generally not used on the feeder lines because they typically service many more customers, where an operated fuse on a feeder line will disrupt power to many locations for a prolonged duration, even if the fault is temporary.

Reclosers or other types of switching devices and breakers are typically employed at certain intervals along the feeder lines and include sensing and monitoring equipment and devices that detect high current because of a fault and automatically cause an interrupter switch to open to prevent current flow downstream of the recloser. Conventional reclosers are generally configured to open in response to the detected high current, wait some minimal period of time, then close again to determine if the high current is still occurring to determine if the fault is intermittent or permanent. If the fault is still present, this operation is performed a number of times before the recloser determines the fault is a permanent fault, where the recloser will be locked out and be maintained in the open position until the fault has been cleared and the recloser has been reset. Thus, if the fault is an intermittent fault as determined by the reclosing operation, power will only be interrupted for a few seconds, before the system returns to normal operation.

In the conventional reclosing operation to identify an intermittent or permanent fault as just described, the full fault current is applied to the feeder line when the recloser is closed if the fault is still occurring. That high current can have detrimental effects on various equipment and devices as a result of mechanical and electrical stresses caused by the high current because it generally takes about three cycles of current or longer for the recloser to again identify the high fault current and then open the switch.

In response to this problem, it is known in the art to employ what is known as pulse testing, where a pulse of current is applied to the feeder line instead of closing the recloser and measuring the current to determine if the full fault current is detected. For the pulse test, the analysis of whether the feeder line current indicates a fault is performed after the recloser has been reopened. Thus, pulse testing can test for a fault without subjecting the feeder line to the adverse effects of the full fault current. However, certain types of intermittent or evolving faults may not be present at the time the recloser pulses the switch closed and open to test the circuit, which may lead to inaccurate fault predictions.

SUMMARY

This disclosure describes a method for detecting faults in an electrical power distribution network, where the network includes a power source, a feeder line coupled to the power source and receiving a power signal therefrom, a plurality of lateral lines coupled to the feeder line and receiving power from the feeder line, and a plurality of loads coupled to and receiving power from the lateral lines. Reclosers are provided in the feeder line that monitor the power signal and are operable to selectively open and close to allow or prevent current flow therethrough. The method includes measuring the current flowing through the recloser, detecting a fault current indicating a fault is present in the feeder line or one of the lateral lines, and opening a switch in the recloser in response to detecting the fault current. The method coducts pulse testing wherein including generating a first pulse having a first duration time, and analyzes the system voltages and the current flow in the recloser after the first pulse duration time ends. A second pulse having a second duration time is that is a longer than the first pulse duration time is introduced if it is determined that no fault current exists during the first pulse duration time. The method then analyzes the current flow in the recloser after the second pulse duration time to determine if an intermittent fault is present.

Additional features of the embodiments will become apparent from the following description and appended claims, taken in conjunction with the accompanying drawings.

DETAILED DESCRIPTION OF THE EMBODIMENTS

The following discussion of the embodiments directed to a method for identifying intermittent faults in an electrical power distribution network is merely exemplary in nature, and is in no way intended to limit the invention or its applications or uses.

Figure 1:
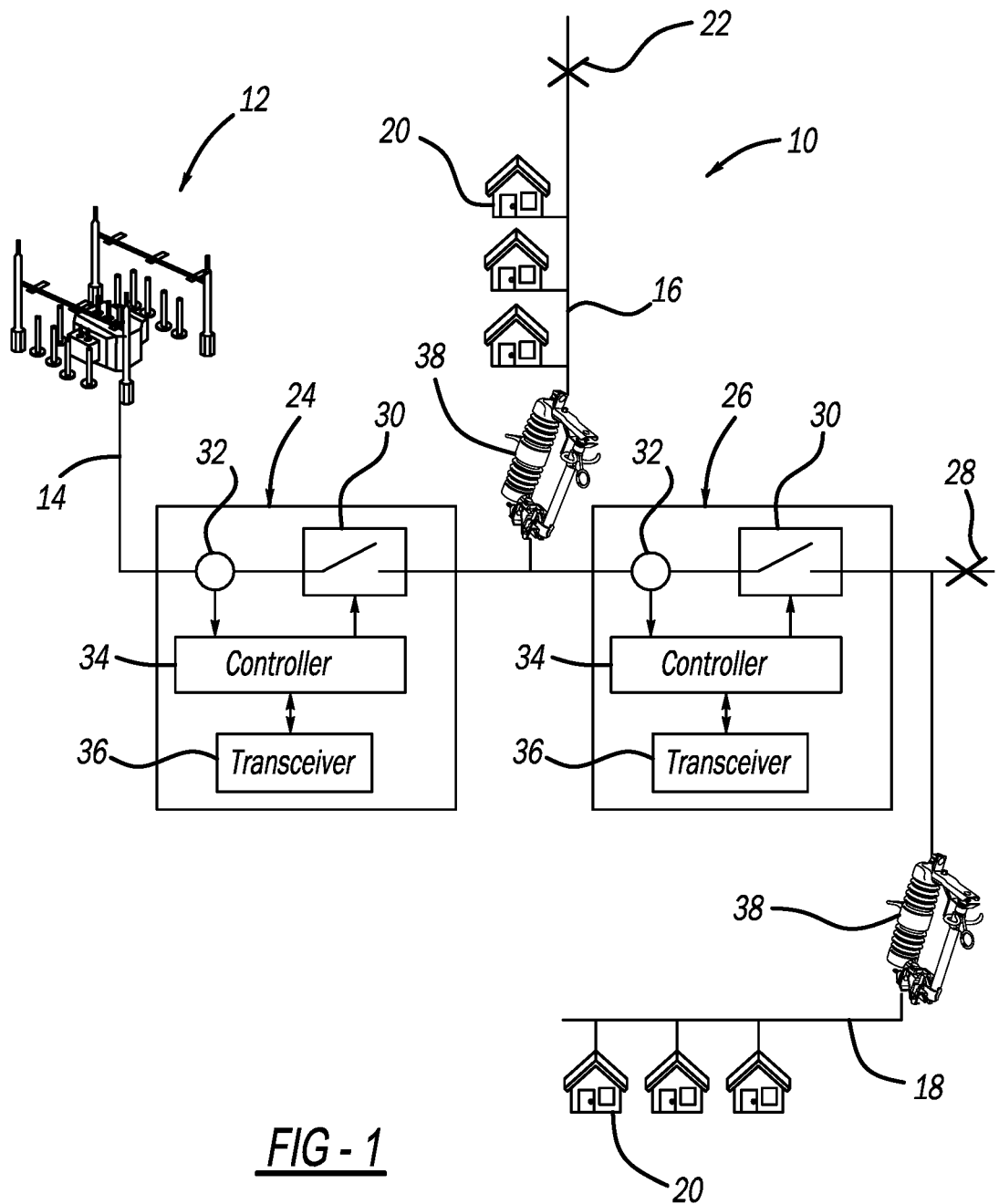
FIG. 1 is a simplified schematic illustration of an electrical power distribution network.

FIG. 1 is a schematic type diagram of an electrical power distribution network 10 including an electrical substation 12 that steps down high voltage power from a high voltage line (not shown) to medium voltage power, a feeder line 14 that receives a medium voltage power signal from the substation 12, and a number of lateral lines, illustrated here as lateral lines 16 and 18, that receive the medium voltage power signal from the feeder line 14. The medium voltage power signal is stepped down to a low voltage signal by a number of transformers (not shown) strategically positioned along the lateral lines 16 and 18, and the low voltage signal is then provided to a number of loads 20 represented here as homes.

The feeder line 14 includes a number of reclosers of the type discussed above provided at certain intervals along the feeder line 14 typically configured on a utility pole and illustrated here as an upstream recloser 24 and a downstream recloser 26, where the upstream recloser 24 receives the medium voltage signal from the substation 12 before the downstream recloser 26. The reclosers 24 and 26 include a relay or interrupter switch 30 for opening and closing the reclosers 24 and 26 during high current to allow or prevent current flow therethrough on the feeder line 14. The reclosers 24 and 26 also include a sensor 32 for measuring the current and voltage of the power signal propagating on the feeder line 14, a controller 34 for processing the measurement signals and controlling the position of the switch 30, and an optional transceiver 36 for transmitting data and messages to a control facility (not shown). The operation and configuration of reclosers of this type are well understood by those skilled in the art. The lateral lines 16 and 18 include a fuse 38 positioned between the feeder line 14 and the first load 20 in the lateral lines 16 and 18. Each fuse 38 is an independent electrical device that is not in communication with other components or devices in the network 10, where the fuse 38 creates an open circuit if an element within the fuse 38 heats up above a predetermined temperature so as to prevent short-circuit faults on the lateral lines 16 and 18 from affecting other parts of the network 10.

Figure 2:
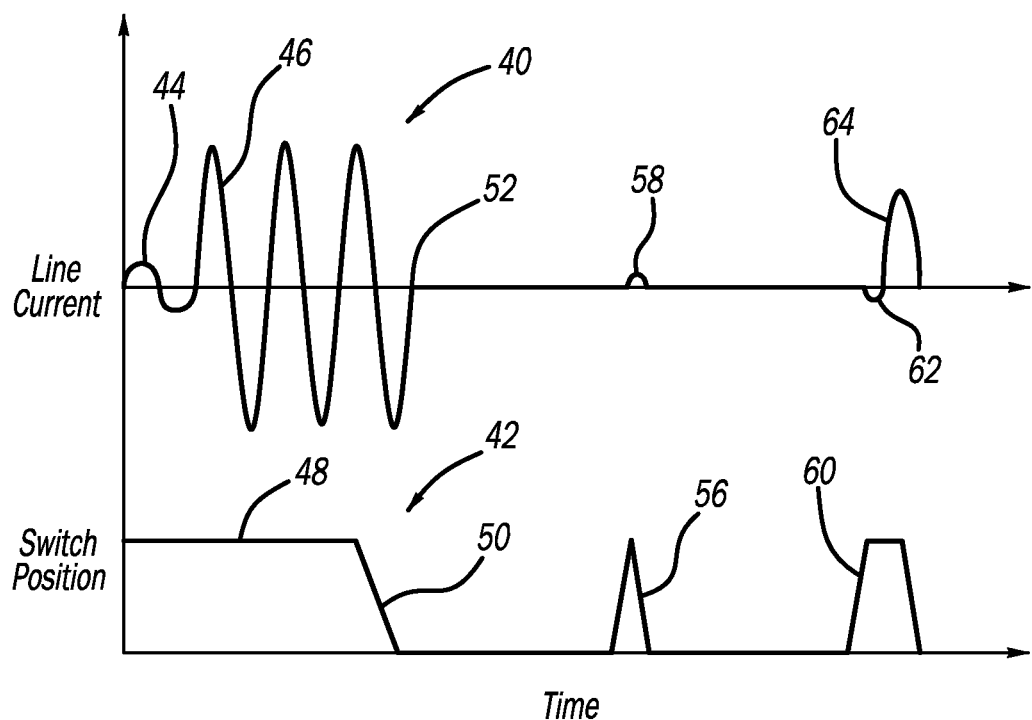
FIG. 2 is a graph with time on the horizontal axis and feeder line current and recloser switch position on the vertical axis showing a relationship between the recloser switch position and the feeder line current during a pulse testing operation.

FIG. 2 is a graph with time on the horizontal axis and feeder line current and recloser switch position on the vertical axis, where graph line 40 shows the feeder current over time during a fault occurrence and graph line 42 shows the open or closed position of the switch 30 in the recloser 24 or 26 during that time, where a high signal indicates the switch 30 is closed. At location 44 in the graph line 40, the measured current on the feeder line 14 is normal and no fault on the feeder line 14 or the lateral lines 16 and 18 exists. If a fault occurs downstream of the recloser 24 or 26, for example, at location 28 in the feeder line 14, the measured feeder line current in the recloser 24 and/or 26 increases at location 46 in the graph line 40. During normal operation and at the beginning of the fault, the switch 30 is closed at location 48 in the graph line 42. The controller 34 identifies the high fault current from the current measurements and opens the switch 30 at location 50 in the graph line 42, where location 52 in the graph line 40 indicates that the feeder line current then goes to zero. The time it takes the recloser 24 or 26 to identify a high fault current and cause the switch 30 to open is at least three cycles of current at the system frequency, such as 50 Hz or 60 Hz, which may be providing significant stress on the network components during that time.

The controller 34 employs algorithms for pulse testing to determine if a fault is still present or is temporary and has cleared. Specifically, the controller 34 sends a pulse generation signal at location 56 in the graph line 42 some predetermined time after it has opened the switch 30 when the fault is detected. Typically, the pulse has a duration that allows a fraction of a cycle of current at the system frequency. This short duration pulse of current at location 58 in the graph line 40, for example as a result of very quick closing and opening of the switch 30 that generates a short duration pulse, shows that the fault is not present because the magnitude of the current is normal. The magnitude of the current is analyzed by the controller 34 sometime after the pulse ends to make the determination that the fault is or is not still present. In known pulse testing processes, this pulse closing of the switch 30 would occur once to several times before the controller 34 determined that the fault has or has not been cleared. If the fault is still present, the short duration of the fault current during the pulse has limited energy and does not cause a significant effect on the system components. However, in some cases the test pulses are not able to indicate that the fault is intermittent and has not been cleared, where the switch 30 is closed after the pulse test indicates no fault, but the fault current reappears a few cycles after closing. Thus, it would again take at least three current cycles for the recloser 24 or 26 to identify the high fault current, and open the switch 30 again. Thus, the high stresses on the system components as a result of the fault current would occur again.

As mentioned, although the pulse testing technique is effective in many cases for indicating that a fault has or has not been cleared, in certain fault situations that are intermittent or temporary, the duration of the pulse is not long enough to indicate that the fault is still present or for the fault to evolve. Therefore, the present disclosure proposes providing an additional second pulse having a longer, but still short, duration than the initial pulse so that many of those types of intermittent faults that may not be detected by the pulse testing process can be detected without the need to close the switch 30 and again identify the fault over three high current cycles or longer.

As discussed above, the current measurement at the location 58 indicates that the fault is not present. Instead of initiating a second short duration pulse as is done in current testing closing schemes, the controller 34 causes a longer duration pulse at location 60 in the graph line 42. In one non limiting embodiment, the second pulse occurs over about a cycle and a half of current at a frequency of 60 Hz or about 20 milliseconds. In this example, the measured current initially indicates that the fault is not present at location 62 in the graph line 40, but then shows that the fault is still present at location 64 in the graph line 40. This initial indication that the fault is not present occurs over a time about equal to the duration of the first test pulse indicating that a second test pulse of that duration also would have identified no fault. The switch 30 may be caused to generate the second pulse, for example by briefly closing, at a time when the current measurement signal will have an opposite polarity to that caused by the first switch closing pulse to help prevent false positives. Although a change from unfaulted to faulted can happen at any time, generally when the current signal cycles positive at the location 64, this longer duration pulse shows that the fault is still occurring because of the magnitude of the current and other characteristics, and thus the switch 30 is prevented from closing until the fault is cleared. By creating a second pulse for this slightly longer period of time, the fault current is still not enough to cause any significant equipment stress, but is long enough to identify that the fault is still present. Just as with the first pulse, the analysis of whether the fault is still present occurs after the second pulse has ended.

Figure 3:
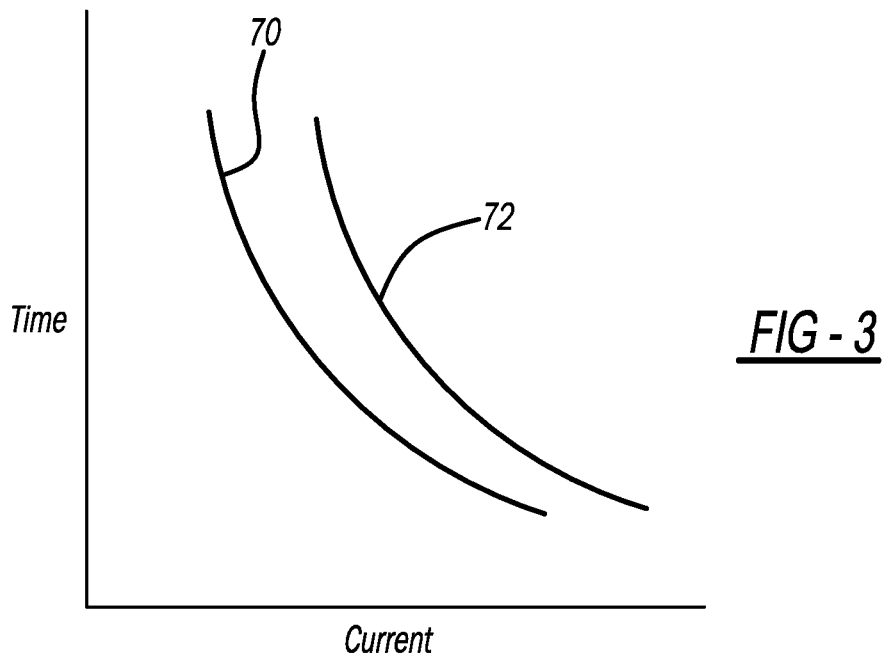
FIG. 3 is a graph with current on the horizontal axis and time on the vertical axis showing time current characteristics (TCC) curves for a fuse and a recloser.

In the situation where a fault occurs on the lateral line 16 or 18, for example, at fault location 22, the network 10 may be configured so that the fuse 38 on that line 16 or 18 is opened before any of the switches 30 in the reclosers 24 and 26 are opened, which prevents the opening of a recloser on the feeder line 14 from affecting the loads 20 on other lateral lines. To accomplish this, the fuses 38 will have a time current characteristic (TCC) curve that is faster than the TCC curve of the reclosers 24 and 26, where the TCC curve defines how quickly the particular device will be opened for a particular fault current level. This is illustrated by the graph shown in FIG. 3, where current is on the horizontal axis and time is on the vertical axis. Graph line 70 represents a fuse TCC curve and graph line 72 represents a recloser TCC curve, which shows that the time it takes the fuse 38 and the switch 30 to open in response to a fault is shorter as the current increases, but the time for the fuse 38 to open is always less than the time for the switch 30 to open for a specific current. Therefore, since the fuse 38 has a lower TCC curve than the reclosers 24 and 26, it will be opened in response to a fault on the lateral line 16 or 18 before the switch 30 is opened. Once the fuse 38 is opened, then the fault current is removed from the recloser 24 and/or 26, and they will not be counting to their TCC curves thereafter. If the fault is on the feeder line 14, then the fuse 38 will not see the fault, and will not open, but the switch 30 will open once it reaches its TCC curve. Thus, by setting the TCC curves for the fuses 38 and the reclosers 24 and 26 in this manner, there is fault current coordination between the fuses 38 and the reclosers 24 and 26 without communication therebetween.

It has been suggested in the art to coordinate the TCC curves of the reclosers 24 and 26 along the feeder line 14 so that those reclosers at an upstream position relative to other reclosers have longer TCC curves so that they will not close during a fault if the fault is downstream from other reclosers in the line 14. In other words, it is desirable to limit the number of loads that are affected by a fault by preventing reclosers from opening during a fault if the fault can be isolated by opening other downstream reclosers. However, assuming that the graph line 72 represents the TCC curve of the recloser closest to the substation 12, or at the substation 12, the number of TCC curves that realistically can be provided between the TCC curves 70 and 72 is limited.

In order to address this situation, pulse finding technologies may be employed that provide coordination between reclosers and other devices in combination with the above described pulse testing process. For pulse finding processes, all of the reclosers are given the same TCC curve. When a fault occurs, all of the reclosers upstream of the fault are opened, and then the most upstream recloser tests the circuit for an intermittent fault using the pulse closing process. If that recloser is not the first recloser upstream of the fault, assuming the fault is still present, then it will not detect the fault during the test, and will be closed because one or more downstream reclosers are open. This same process is performed by the next most upstream recloser and so on until the recloser that is the first upstream recloser from the fault detects the fault and remains open while the rest of the upstream reclosers remain closed. However, for certain intermittent faults such as described above, the recloser immediately upstream of the fault will not detect the fault because it is not occurring at the point in time when the switch 30 is pulsed tested, and thus will close. When the fault reappears, all of the reclosers upstream of the fault that have the same TCC curve will be opened again. If this process repeats three or more times for the pulse testing process, then all of the reclosers upstream of the fault may end up being locked open, and thus more loads than are necessary will be affected.

The present disclosure proposes to maintain the coordination between the reclosers as described for the pulse finding process, but employ a temporary instantaneous TCC curve for the upstream recloser after it has performed a successful pulse closing test. Because reclosers are electronic devices, they can be immediately switched between different TCC curves at any point in time. The upstream recloser will maintain the instantaneous TCC curve until the next recloser downstream starts its switch pulse testing sequence, and then will return to its original TCC curve. Most intermittent faults would appear within that interval. If a fault does appear, it will be on the network only for a few current circuit cycles. Further, all reclosers further upstream remain closed as they have already shifted to their normal, slower TCC curve. It is noted that the term instantaneous TCC curve is used to describe this embodiment of the invention, however, instantaneous is used generally to describe a very quick TCC curve, and may have some actual time associated with it.

Figure 4:
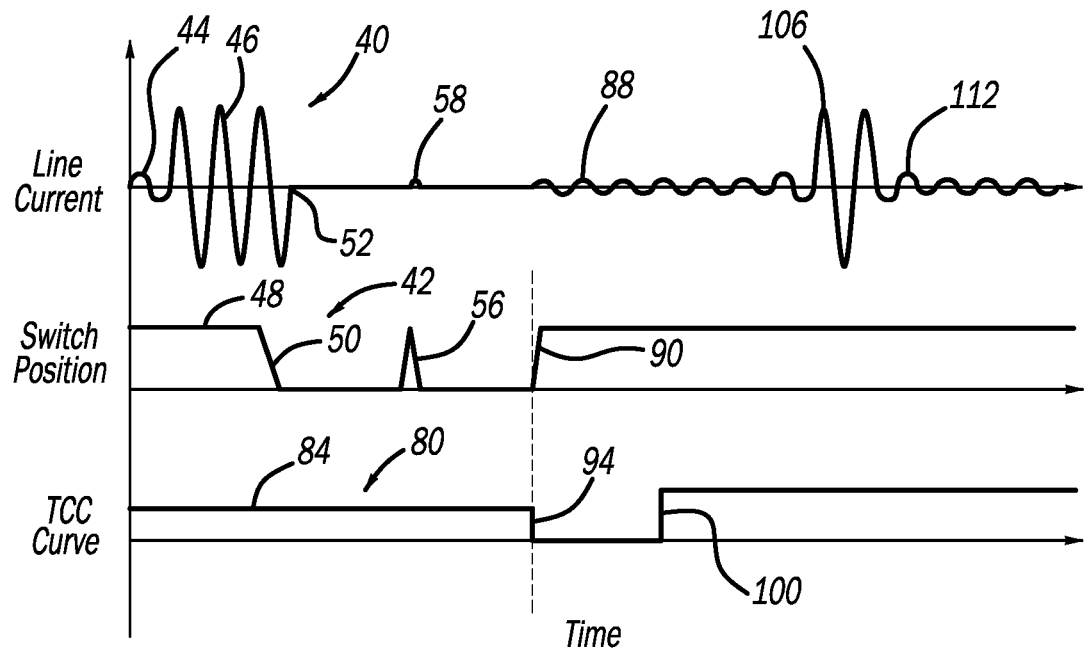
FIG. 4 is a graph with time on the horizontal axis and feeder line current, recloser switch position and TCC curve selection on the vertical axis showing a relationship between feeder line current, recloser switch position and TCC curve selection during a pulse finding operation for an upstream recloser.
Figure 5:
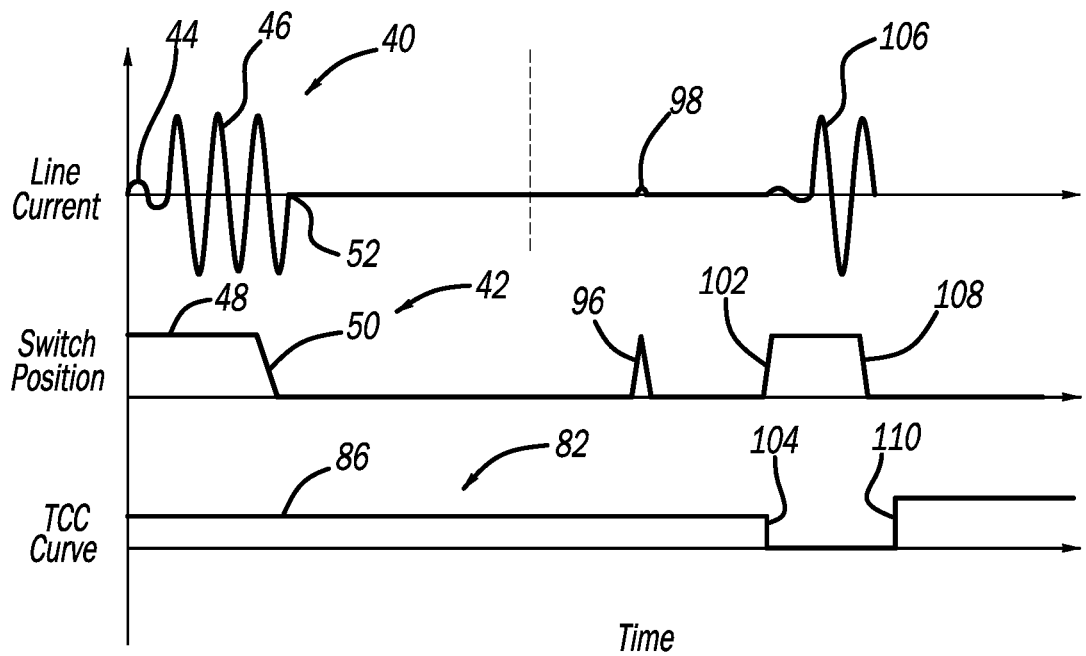
FIG. 5 is a graph with time on the horizontal axis and feeder line current, recloser switch position and TCC curve selection on the vertical axis showing a relationship between feeder line current, recloser switch position and TCC curve selection during a pulse finding operation for a downstream recloser.

FIG. 4 is a graph with time on the horizontal axis and feeder line current, recloser switch position and TCC curve selection or trip time for a fault event on the vertical axis showing a relationship between the feeder line current, recloser switch position and TCC curve selection during a pulse finding operation as discussed for the upstream recloser 24, and FIG. 5 is a graph with time on the horizontal axis and feeder line current, recloser switch position and TCC curve selection on the vertical axis showing a relationship between the feeder line current, recloser switch position and TCC curve selection during a pulse finding operation for the downstream recloser 26 during the intermittent fault scenario referred to above for FIG. 2, where like elements are identified by the same reference number. As above, the fault is downstream of the recloser 26 at the location 28. Graph line 80 represents the selection of the TCC curve for the upstream recloser 24 and graph line 82 represents the selection of the TCC curve for the downstream recloser 26, where the greater the magnitude the longer the TCC's trip time.

During normal operation, the reclosers 24 and 26 have the same TCC curve, for example, TCC0 at locations 84 and 86, respectively. The upstream recloser 24 and the downstream recloser 26 see the fault current at the same time and open their switches 30 at the location 50 in the same manner as in the example of FIG. 2. The upstream recloser 24 provides the first test pulse at the location 56 to detect whether the fault is still occurring before the downstream recloser 26 initiates a test pulse. If the upstream recloser 24 does not detect the fault during the test at the location 58 because the fault has cleared or because the recloser 24 is upstream of the fault 28 and the downstream reclosers are open, the upstream recloser 24 closes its switch 30 at location 90 in the graph line 42, where normal current flow occurs at location 88 in the graph line 40. At this time, the recloser 24 changes to an instantaneous TCC curve at location 94 in the graph line 80. At the same time that the upstream recloser 24 closes its switch 30, power is restored to the downstream recloser 26, but its switch 30 is still open. If the upstream recloser 24 was the first recloser upstream of the fault 28 and the fault 28 was still occurring, then it would be immediately opened because of its instantaneous TCC curve.

At some predetermined short time period thereafter, for example, 100 milliseconds, and while the recloser 24 still has an instantaneous TCC curve, the downstream recloser 26 will initiate a test pulse at location 96 in the graph line 42 and the feeder line current will indicate that the fault is not present at location 98 in the graph line 40. At about the same time that the downstream recloser 26 initiates its test pulse, the upstream recloser 24 will change to a longer duration TCC curve, for example, TCC1, than the original TCC curve at location 100 in the graph line 80 so that it will not react as fast as the downstream recloser 26 having the TCC0 curve. Using the longer TCC1 curve is by way of example as being standard in the industry for known pulse finding processes. When the downstream recloser 26 determines that the fault current is not present, it will close its switch 30 at location 102 in the graph line 42 and will go into an instantaneous TCC curve at location 104 in the graph line 82.

At some later time when both of the upstream and downstream reclosers 24 and 26 have closed their switches 30, the fault 28 may reappear, and the feeder line current will increase at location 106 in the graph line 40, and the downstream recloser 26 will open its switch 30 at location 108 in the graph line 42. Since the TCC curve of the upstream recloser 24 is longer than the instantaneous TCC curve for the downstream recloser 26 at this time, its switch 30 will remain closed and the feeder line current will return to normal at location 112 in the graph line 40. Shortly thereafter, the TCC curve of the downstream recloser 26 will be changed to TCC1 at location 110 in the graph line 82 to be the same TCC curve at the upstream recloser 24. In this example, the recloser 26 is the first recloser upstream of the fault 28. If the downstream recloser 26 did not detect the fault current at the location 106 because it is upstream of another recloser that is upstream of the fault, then the downstream recloser 26 will keep its switch 30 closed and will become the upstream recloser for the test pulse provided by a farther downstream recloser. Thus, this process is continued in the line of reclosers in sequence until the first upstream recloser from the fault 28 remains open, where all of the loads upstream of that recloser will be receiving power.

The foregoing discussion discloses and describes merely exemplary embodiments. One skilled in the art will readily recognize from such discussion and from the accompanying drawings and claims that various changes, modifications and variations can be made therein without departing from the spirit and scope of the disclosure as defined in the following claims.

What is claimed is:

1. A method for detecting faults in an electrical power distribution network, the network including a power source, a feeder line coupled to the power source and receiving a power signal therefrom, a plurality of lateral lines coupled to the feeder line and receiving the power signal from the feeder line, and a plurality of loads coupled to and receiving the power signal from the lateral lines, the feeder line including a switching device that monitors the power signal on the feeder line and is operable to allow or prevent the power signal from flowing through the device, said method comprising:
    measuring a current flow through the switching device;
    identifying that a fault current is present indicating a fault in the feeder line or one of the lateral lines;
    opening a switch in the switching device in response to detecting the fault current;
    generating a first pulse having a first duration time;
    analyzing network voltages and the current flow through the switching device that occurred during the first pulse duration time after the first pulse duration time has ended;
    generating a second pulse duration time that is longer than the first pulse duration time if it is determined that no fault current was present during the first pulse duration time; and
    analyzing the network voltages and the current flow through the switching device that occurred during the second pulse duration time after the second pulse duration time has ended.

2. The method according to claim 1 further comprising opening the switch if it is determined that the fault current is present during the second pulse duration time.

3. The method according to claim 2 further comprising generating the second pulse having the second duration pulse time again if it is determined that no fault current was present during the second pulse duration time.

4. The method according to claim 1 wherein the first pulse duration time is about 0.5 current cycles long.

5. The method according to claim 1 wherein the second pulse duration time is about 1.5 current cycles long.

6. The method according to claim 1 wherein generating the first pulse comprises closing and opening the switch for a first pulse duration time.

7. The method according to claim 1 wherein generating the second pulse for the second duration time includes closing and opening the switch for the second duration time.

8. The method according to claim 1 wherein the switching device is a recloser.

9. The method according to claim 1 wherein the power source is an electrical substation and the electrical power distribution network is a medium voltage power distribution network.

10. A method for detecting intermittent faults in an electrical feeder line, the method comprising:
- measuring a current flow through a recloser in the feeder line;
- identifying that a fault current is present indicating a fault in the feeder line;
- opening a switch in the recloser in response to detecting the fault current;
- closing and opening the switch in a pulsed manner for a first pulse duration time; and
- closing and opening the switch in a pulsed manner for a second pulse duration time that is longer than the first pulse duration time if it is determined that no fault current was present during the first pulse duration time.

11. The method according to claim 10 further comprising opening the switch if it is determined that the fault current was present during the second pulse duration time.

12. The method according to claim 11 further comprising closing and opening the switch in a pulsed manner for the second duration pulse time again if it is determined that no fault current was present during the second pulse duration time.

13. The method according to claim 10 wherein the first pulse duration time is about 0.5 current cycles long at a frequency of 60 Hz.

14. The method according to claim 10 wherein the second pulse duration time is about 1.5 current cycles long at a frequency of 60 Hz.

15. The method according to claim 10 wherein closing and opening the switch for a first pulse duration time includes closing and opening the switch when the current has a positive value.

16. The method according to claim 10 wherein closing and opening the switch for the second pulse duration time includes closing and opening the switch when the current initially has a negative value.

17. A system for detecting faults in an electrical power distribution network, the network including a power source, a feeder line coupled to the power source and receiving a power signal therefrom, a plurality of lateral lines coupled to the feeder line and receiving the power signal from the feeder line, and a plurality of loads coupled to and receiving the power signal from the lateral lines, said feeder line including a switching device that monitors the power signal on the feeder line and is operable to the power signal from flowing through the device, the system comprising:
- a current sensor associated with the switching device to measure a current flow through the switching device and to provide a current signal to a controller;
- the controller being configured to receive the current signal and to determine therefrom that a fault current is present indicating a fault in the feeder line or one of the lateral lines;
- the controller being further configured to provide an open signal to the switching device to cause a switch in the switching device to open in response to the signal when a fault in the feeder line is indicated;
- the controller being further configured to provide a first pulse signal to the switching device to cause a pulse generator within the switching device to generate a first pulse having a first pulse duration time;
- the controller being further configured to analyze network voltages and the current flow through the switching device that occurred during the first pulse duration time after the first pulse duration time has ended to determine the continuing presence of the fault;
- the controller being further configured to provide a second pulse signal to the switching device to cause a pulse generator within the switching device to generate a second pulse having a second pulse duration time that is longer than the first pulse duration time if it is determined that no fault current was present during the first pulse duration time; and
- the controller being further configured to analyze network voltages and the current flow through the switching device that occurred during the second pulse duration time after the second pulse duration time has ended to determine the continuing presence of the fault.

18. The system according to claim 17 wherein the first pulse duration time is about 0.5 current cycles long and the second pulse duration time is about 1.5 current cycles long at a frequency of 60 Hz.

19. The system according to claim 17 wherein the pulse generator comprises means for closing and opening the switch for a first pulse duration time when the power signal has a positive value and for closing and opening the switch for the second pulse duration time when the power signal initially has a negative value.

* * * * *